· US009278886B2

(12) United States Patent
Boek et al.

(10) Patent No.: US 9,278,886 B2
(45) Date of Patent: Mar. 8, 2016

(54) METHODS OF FORMING HIGH-DENSITY ARRAYS OF HOLES IN GLASS

(75) Inventors: Heather Debra Boek, Corning, NY (US); Robert Carl Burket, Elkland, PA (US); Daniel Ralph Harvey, Bath, NY (US); Alexander Mikhailovich Streltsov, Corning, NY (US)

(73) Assignee: Corning Incorporated, Corning, NY (US)

(*) Notice: Subject to any disclaimer, the term of this patent is extended or adjusted under 35 U.S.C. 154(b) by 137 days.

(21) Appl. No.: 13/989,914

(22) PCT Filed: Nov. 30, 2011

(86) PCT No.: PCT/US2011/062520
§ 371 (c)(1),
(2), (4) Date: May 28, 2013

(87) PCT Pub. No.: WO2012/075072
PCT Pub. Date: Jun. 7, 2012

(65) Prior Publication Data
US 2013/0247615 A1    Sep. 26, 2013

Related U.S. Application Data

(60) Provisional application No. 61/418,152, filed on Nov. 30, 2010.

(51) Int. Cl.
*B23K 26/382*    (2014.01)
*C03C 23/00*    (2006.01)
(Continued)

(52) U.S. Cl.
CPC ........... *C03C 23/0025* (2013.01); *B23K 26/382* (2015.10); *B23K 26/384* (2015.10);
(Continued)

(58) Field of Classification Search
CPC .. B23K 26/381; B23K 26/383; B23K 26/385; B23K 26/4075

USPC .............................................. 65/97, 105, 106
See application file for complete search history.

(56) References Cited

U.S. PATENT DOCUMENTS 5,919,607 A    7/1999 Lawandy
6,754,429 B2    6/2004 Borrelli et al.
(Continued)

FOREIGN PATENT DOCUMENTS

CN    1845812 A  * 10/2006
WO    2009072810 A2    6/2009

OTHER PUBLICATIONS

International Searching Authority; International Search Report; Mailing Date: Aug. 22, 2012; pp. 1-3.
(Continued)

*Primary Examiner* — Jason L Lazorcik
(74) *Attorney, Agent, or Firm* — John T. Haran

(57) ABSTRACT

A method of fabricating a high-density array of holes in glass is provided, comprising providing a glass piece having a front surface, then irradiating the front surface of the glass piece with a UV laser beam focused to a focal point within +/−100 μm of the front surface of the glass piece most desirably within +/−50 μm of the front surface. The lens focusing the laser has a numerical aperture desirably in the range of from 0.1 to 0.4, more desirably in the range of from 0.1 to 0.15 for glass thickness between 0.3 mm and 0.63 mm, even more desirably in the range of from 0.12 to 0.13, so as to produce open holes extending into the glass piece 100 from the front surface 102 of the glass piece, the holes having an diameter the in range of from 5 to 15 μm, and an aspect ratio of at least 20:1. For thinner glass, in the range of from 0.1-0.3 mm, the numerical aperture is desirably from 0.25 to 0.4, more desirably from 0.25 to 0.3, and the beam is preferably focused to within +/−30 μm of the front surface of the glass. The laser is desirable operated at a repetition rate of about 15 kHz or below. An array of holes thus produced may then be enlarged by etching. The front surface may be polished prior to etching, if desired.

20 Claims, 5 Drawing Sheets

(51) Int. Cl.
*B23K 26/38* (2014.01)
*B23K 26/40* (2014.01)
*C03C 15/00* (2006.01)
*G02B 6/122* (2006.01)
*G02B 6/136* (2006.01)

(52) U.S. Cl.
CPC ............ *B23K26/386* (2013.01); *B23K 26/402* (2013.01); *C03C 15/00* (2013.01); *G02B 6/1225* (2013.01); *G02B 6/136* (2013.01)

(56) References Cited

U.S. PATENT DOCUMENTS

| | | | |
|---|---|---|---|
| 6,990,285 B2 * | 1/2006 | Schroeder | B23K 26/0648 385/134 |
| 7,033,519 B2 * | 4/2006 | Taylor et al. | 216/87 |
| 7,057,135 B2 * | 6/2006 | Li | 219/121.83 |
| 2003/0150839 A1 | 8/2003 | Kobayashi et al. | |
| 2004/0188393 A1 * | 9/2004 | Li et al. | 219/121.7 |
| 2005/0142812 A1 | 6/2005 | Kurosawa | |
| 2006/0207976 A1 * | 9/2006 | Bovatsek et al. | 219/121.69 |
| 2008/0314883 A1 * | 12/2008 | Juodkazis et al. | 219/121.72 |
| 2009/0013724 A1 * | 1/2009 | Koyo et al. | 65/31 |
| 2010/0050692 A1 * | 3/2010 | Logunov et al. | 65/31 |
| 2010/0119808 A1 * | 5/2010 | Li et al. | 428/312.6 |
| 2011/0256344 A1 * | 10/2011 | Ono et al. | 428/131 |
| 2012/0052302 A1 | 3/2012 | Matusick et al. | |
| 2013/0209731 A1 * | 8/2013 | Nattermann et al. | 428/131 |
| 2014/0116091 A1 * | 5/2014 | Chuang et al. | 65/31 |
| 2014/0199519 A1 * | 7/2014 | Schillinger et al. | 428/155 |

OTHER PUBLICATIONS

Patent Cooperation Treaty International Notification of Transmittal of the International Search Report and The Written Opinion of the International Searching Authority, international application No. PCT/US2011/062520; mailing date Aug. 22, 2012, 9 pages.

"Micro-machinability of silver-sodium ion-exchanged glass by UV nanosecond laser", A. Matsusaka and T. Watanabe (2008). J. Materials Processing Technology, 514-520.

"Projection ablation of glass-based single and arrayed microstructures using excimer laser", Y-T Chen, K-J Ma, A.A. Tseng, and P.H. Chen. (2005) Optics and Laser Technology 37, 271-280.

"Etched Laser Filament Tracks in Glasses and Polymers", E. Uzgiris and R. Fleischer. (1973) Phys. Rev. A 7, 734-740.

"Micromachining of glass by the third harmonic of nanosecond Nd:YVO4 laser", A. Ramil, J. Lamas, J.C. Alvarez, A.J. Lopez, E. Saavedra, and A. Yanez (2009). Applied Surface Science 255, 5557-5560.

Notice of Second Office Action and Search Report for Chinese Patent Application No: 201180057698.5, 5 pages, Nov. 12, 2015.

* cited by examiner

# METHODS OF FORMING HIGH-DENSITY ARRAYS OF HOLES IN GLASS

PRIORITY

The present application claims priority to U.S. application Ser. No. 61/418,152 filed Nov. 30, 2010.

FIELD

The present disclosure relates to methods of fabricating high-density arrays of holes in glass, particularly high-density arrays of through-holes, and also particularly high-density arrays of high aspect ratio holes.

BACKGROUND AND SUMMARY

A previously demonstrated process for making such dense arrays of holes in glass is disclosed in U.S. Pat. No. 6,754,429. The disclosed method involves glass exposure with a femtosecond laser followed by acid etching. It relies on selective etching in which the laser-damaged glass etches at a significantly higher rate than the rest of the glass. Although technically sound, this approach utilizes expensive and maintenance-hungry femtosecond laser technology, and the laser exposure process is relatively slow.

According to US Patent Publication No. 20030150839, tapered (conical) holes 120-130 μm in diameter may be made by laser ablation followed by acid etching to remove surface defects and chips. The disclosed process requires an ion-exchange step before laser irradiation. Irradiation conditions beyond laser spot size and fluence are not disclosed.

US Patent Publication 20090013724 describes hole formation by laser irradiation and acid etching in glasses of various compositions. Lasers with wavelengths 355 nm and 266 nm were used. The recommended (numerical) beam aperture is NA<0.07 and the focus is disclosed as either within the glass or behind the back surface. Hole profile and placement accuracy are not specifically addressed.

What is needed is a relatively low-cost and reliable process for forming relatively small holes at relatively tight minimum pitch, with good positioning accuracy and reasonably small variation in diameter throughout the depth.

According to one aspect of the present disclosure, fabricating a high-density array of holes in glass, the method comprises providing a glass piece having a front surface, then irradiating the front surface of the glass piece with a UV laser beam focused to a focal point within +/−100 um of the front surface of the glass piece most desirably within +/−50 um of the front surface. The lens focusing the laser has a numerical aperture desirably in the range of from 0.1 to 0.4, more desirably in the range of from 0.1 to 0.15 for glass thickness between 0.3 mm and 0.63 mm, even more desirably in the range of from 0.12 to 0.13, so as to produce open holes extending into the glass piece 100 from the front surface 102 of the glass piece, the holes having an diameter the in range of from 5 to 15 μm, and an aspect ratio of at least 20:1. For thinner glass, in the range of from 0.1-0.3 mm, the numerical aperture is desirably from 0.25 to 0.4, more desirably from 0.25 to 0.3, and the beam is preferably focused to within +/−30 um of the front surface of the glass. The laser is desirable operated at a repetition rate of about 15 kHz or below, and generally of sufficient irradiation duration to form an open hole extending just up to a back surface of the glass piece. An array of holes thus produced may then be enlarged by etching. The front surface may be polished prior to etching, if desired.

Variations of the methods of the present disclosure are described in the text below and with reference to the figures, described in brief immediately below.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
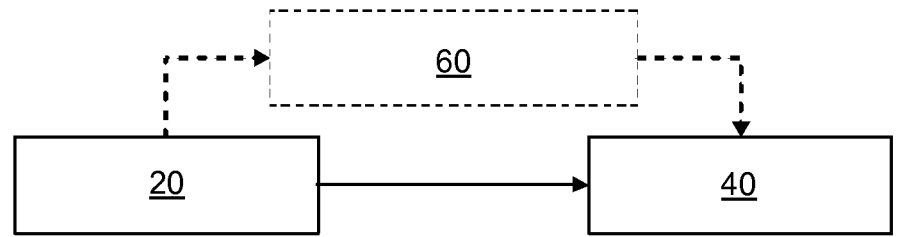
FIG. 1 is a flow diagram representing basic steps of a presently preferred method of the present disclosure.

According to one aspect of the present disclosure, holes of 200 μm or less diameter on a minimum pitch of not more than 300 μm, with variation in diameter limited to 10 μm or less, desirably 5 μm or less, and with placement (hole center) positional variation limited to 8 μm or less, desirably 4 μm or less, are formed in a thin sheet of glass, desirably less than 0.8 mm thick, preferably in the range of 0.1 to 0.63 mm thick. The thinnest or "waist" diameter of the holes is not less than 65% of the diameter of the opening at the surface, desirably not less than 80%.

These results and other beneficial results can be obtained by the methods of the present disclosure, which will be described with general reference to FIGS. 1-3. According to one embodiment of the method of fabricating a high-density array of holes in glass, the method comprises providing a glass piece 100 having a front surface 102, then irradiating the front surface of the glass piece 100 with a UV laser beam 24 in irradiation step 20 represented in FIG. 1. The beam 24 is most desirably focused by a lens 26 to a focal point within +/−100 um of the front surface 102 of the glass piece 100, most desirably within +/−50 um the front surface 102. The lens 26 has a numerical aperture desirably in the range of from 0.1 to 0.4, more desirably in the range of from 0.1 to 0.15 for glass thickness between 0.3 mm and 0.63 mm, even more desirably in the range of from 0.12 to 0.13, so as to produce open holes extending into the glass piece 100 from the front surface 102 of the glass piece, the holes having an diameter the in range of from 5 to 15 μm, and an aspect ratio of at least 20:1. For thinner glass, in the range of from 0.1-0.3 mm, the numerical aperture is desirably from 0.25 to 0.4, more desirably from 0.25 to 0.3, and the beam is preferably focused to within +/−30 um of the front surface of the glass. The laser is desirable operated at a repetition rate of about 15 kHz or below, and generally of sufficient irradiation duration to form an open hole extending just up to a back surface of the glass piece.

The irradiating step 20 of FIG. 1 is performed with a UV laser beam 24 as noted above preferably with a laser beam 24 having a wavelength in the range from 200 to 400 nm, more desirably in the range of from 300-400 nm, most preferably with an Nd:KGW (Neodymium doped Potassium-Gadolinium Tungstate) or other Nd-doped laser 22 operated at 355 nm wavelength, or within 20 nm, preferably 5 nm, thereof. The laser 22 is preferably operated at repetition rate in the range of from 5 to 50 kHz, more preferably in the range of from 10 to 20 kHz, and most preferably in the range of from 12-18 kHz.

The irradiating step 20 of FIG. 1, in order to produce through-holes in EagleXG® glass of 0.63 mm thickness, desirably comprises irradiating the front surface 102 of the glass piece 100 with a UV laser beam 24 for a duration in the range of from 8 to 150 milliseconds per hole, more desirably in the range of from 60 to 120 milliseconds per hole, and most desirably in the range of from 80 to 100 milliseconds per hole. For 0.1 mm thick glass, about 10 milliseconds is desirable, for 0.15 mm glass 25 milliseconds, and for 0.3 mm 30 milliseconds. Thicker glass requires longer exposure (higher pulse count). As an alternative embodiment, the duration desirably may be chosen by experiment or calculation, or by a combination thereof, to be that duration which will cause the resulting hole to extend just up to a back surface 104 of the piece of glass 100. This will allow the method to apply to various glasses having differing behavior under UV laser irradiation.

After irradiation, the resulting high aspect ratio open holes may desirably be etched in an etching step, step 40 of FIG. 1, in an HF+HNO$_3$ solution. HF+HF+HNO$_3$ has been shown in the present work to allow for even etching across substrates with thousands of holes spaced at minimum pitch of as low as 200 μm, in contrast to some other etchant solutions. A desirable concentration is a 20% HF+10% HNO$_3$ solution.

As an optional step, after irradiating 20 and before etching 40, a polishing step 60 may be applied to the front surface 102 of the glass piece 100.

Figure 2:
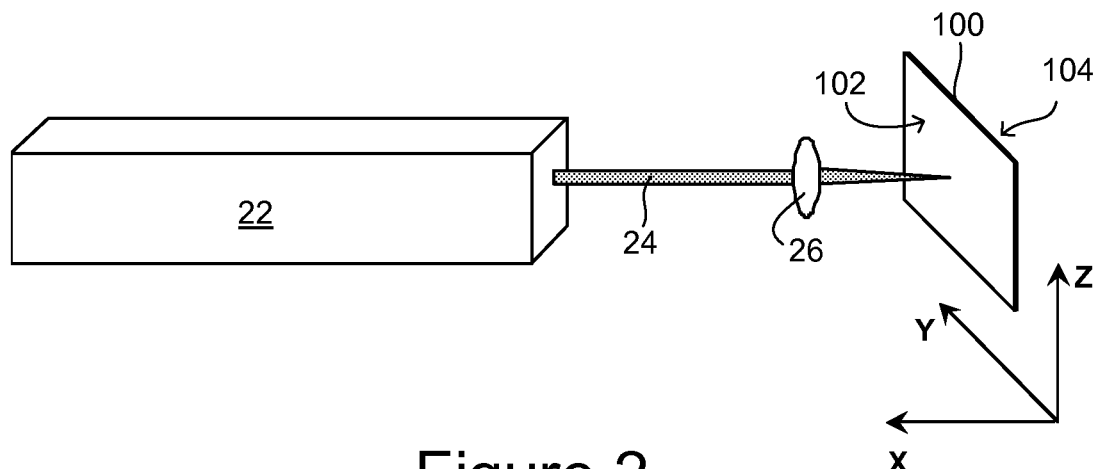
FIG. 2 is a diagrammatic perspective view of a laser irradiation apparatus useful in the methods disclosed herein.
Figure 3:
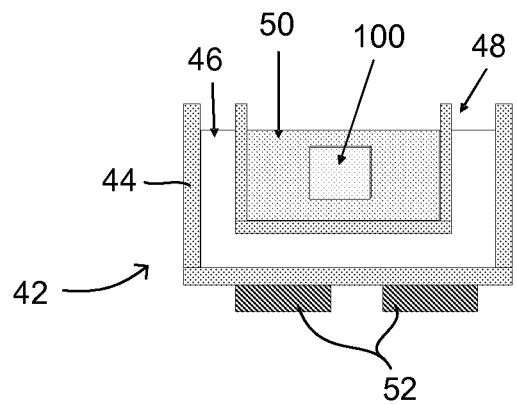
FIG. 3 is a diagrammatic cross section of an etching apparatus useful in the methods disclosed herein.

FIGS. 2 and 3 diagrammatic representation of a laser-exposure setup and an etching station, respectively, useful in the methods of the present disclosure.

The glass piece 100 desirably may placed on a motorized XYZ stage as shown in FIG. 2, which has the accuracy and the repeatability equal or better than 1 um. The laser beam 24 is focused with a lens 26 onto the front surface 102 of the glass 100. The numerical aperture of the lens should ideally be more than approximately NA=0.1. Our beam 24 using a lens 26 with an aperture of NA=0.125 produced well-defined damage.

Figure 9:
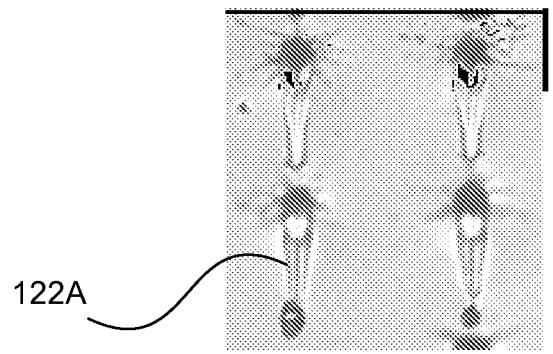
FIG. 9 is an image of holes in a glass piece produced according to a comparative methods.

The currently preferred laser conditions are: 15 kHz repetition rate, 1.5 W mean power, and duration of 90 ms. At higher repetition rates the damage does not have well-defined boundaries as shown in FIG. 9, which is an image of a comparative process where the repetition rate was 100 kHz. Such damage does not result in a quasi-cylindrical hole profile, rather a conical one, at best. Powers lower than about 1.5 W do not produce enough damage while powers above 1.5 W can cause significant front-surface damage, which also leads to a funnel-type hole profile. A 90-ms train/burst of 15-kHz pulses is selected for the exposure and the burst duration is optimized for the damage extending from one side of the glass to the other, in Corning EAGLE XG® glass of 0.63 mm thickness. Longer bursts cause strong rear-surface damage, while shorter burst results in the damage-length decrease.

Figure 4:
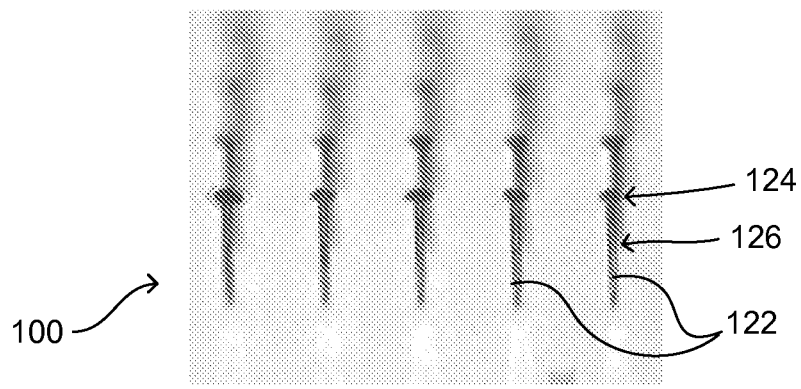
FIG. 4 is an image of holes in a glass piece produced according to methods of the present disclosure.
Figure 5:
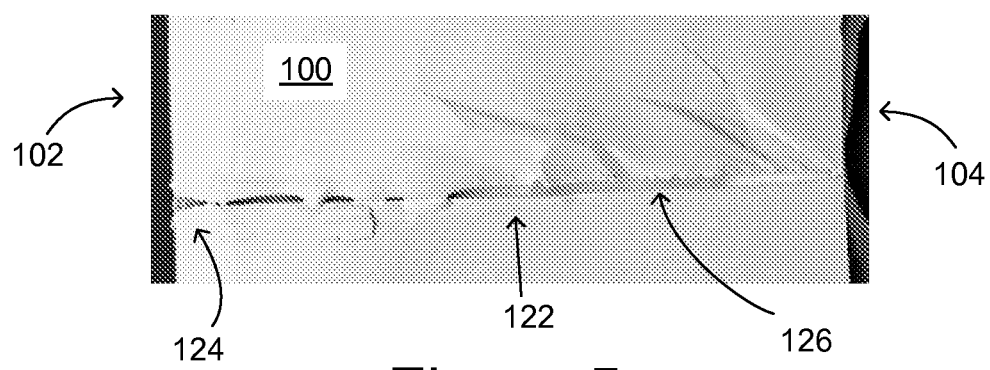
FIG. 5 is an image of fractured glass piece fractured so as to show a partial cross-section of a hole produced according to methods of the present disclosure.

These laser conditions produce open or hollow microchannels of only 7-10 um diameter in glass, as shown in the image of FIG. 4. Compared with laser damage that has microcracks, such as that produced by the comparative process shown in FIG. 9, the micro-channel of FIG. 4 provides much better control over the etched hole profile.

Figure 10:
FIG. 10 is an image of holes in a glass piece produced according to a comparative methods.
Figure 11:
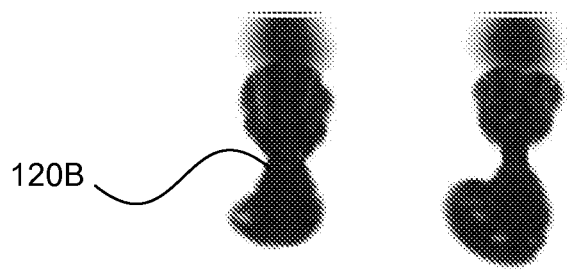
FIG. 11 is an image of holes in a glass piece produced according to comparative methods, after an etching step.

The position of the focus of the beam 24 plays a significant role in damage formation. Damage like that shown in FIG. 4 can be achieved when the beam is focused within +/−100 um from the front glass surface. For better consistency, this range should be reduced to +/−50 um. If the beam is focused closer to the back surface or behind it, the damage looks different, as shown in the image of FIG. 10, and it becomes almost impossible to etch the hole without a waist, as shown in the image of FIG. 11.

Figure 6:
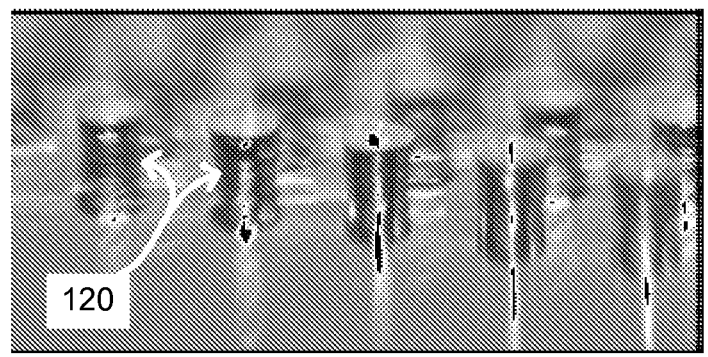
FIG. 6 is an image of holes in a glass piece produced according to methods of the present disclosure, after an etching step.
Figure 7:
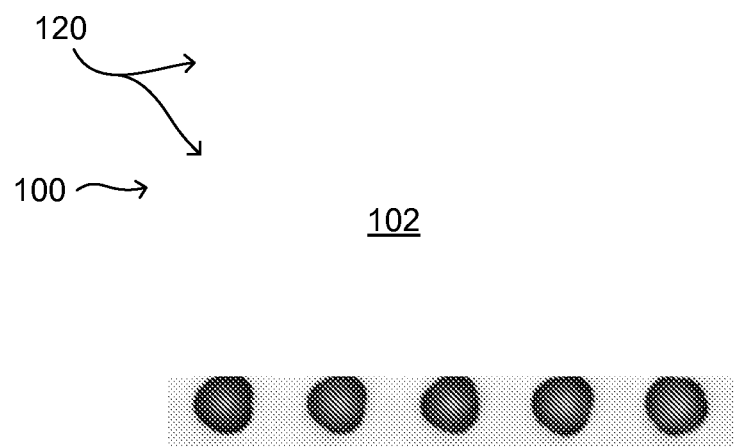
FIG. 7 is a plan-view image of holes in a glass piece produced according to methods of the present disclosure viewed from a front surface of the glass piece.
Figure 8:
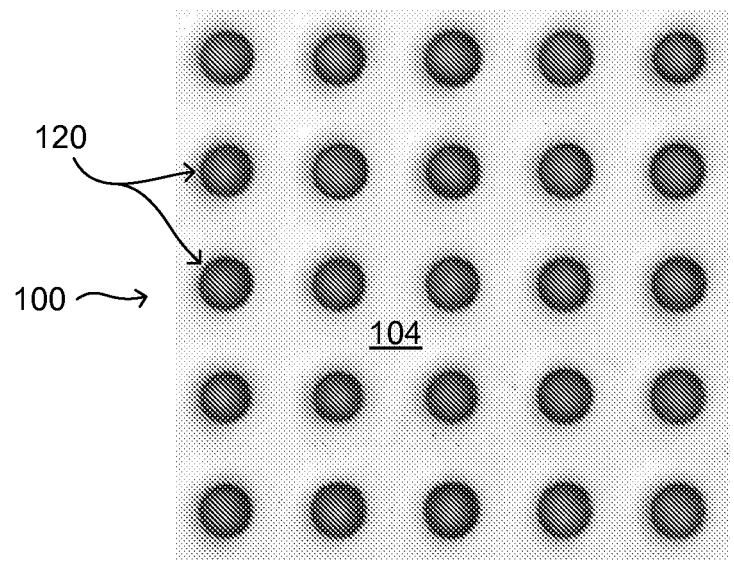
FIG. 8 is a plan-view image of holes in a glass piece produced according to methods of the present disclosure viewed from a back surface of the glass piece.

Under the preferred etching conditions (20% HF+10% HNO3 by volume solution in water, 10-12 min. etching in an ultrasonic bath at approximately 35 C.°), the resulting holes 120 are quasi-cylindrical, as seen in the image of FIG. 6, and basically meeting the requirements stated above. Adding a surfactant to the acid, such as Capstone FS-10, for example, may help to flush the products of etching from glass. The top and the bottom views displayed in FIGS. 7 and 8, as well as the side view image of FIG. 6, are of holes resulting when the optional step of front side polishing 60 is employed. In the sample shown in the images, the front surface was polished by approximately 80 um in order to the remove front-surface damage, prior to the etching step. The front-side opening of the hole can have a more irregular shape without such polishing.

FIG. 3 is a schematic representation of acid etch bench 42 useful in the etching step 40. In FIG. 3, the bench 42 includes an outer tub 44 with a sonic energy transmission fluid 46, such as water, held therein. An acid tub 48 is supported with the fluid 46, and an acid or acid blend 50 is contained therein. The irradiated and annealed glass sheet 100 is submerged in the acid or acid blend 50. Sonic energy is applied by energy transducers 52 to the outer tub 44 and is transmitted through the intervening tubs and fluids to the glass sheet 100 during the etching process.

Etching determines the diameter of the etched hole 120 and its shape. For example, if etching is done using low acid concentrations (1% HF+1% HCl solution by volume in water) for 1 hr., the holes 120 are much smaller. The bottom diameter is 19 um and the top diameter is 65 um. Under these conditions the glass thickness was decreased by 10 um from 0.63 mm to 0.62 mm. Using higher acid concentrations produced the holes of about 100 um in diameter shown in FIGS. 6-8. The etching parameters affecting the resulting hole dimensions include acid concentrations, etchant recipe (or selection of acids), duration of etching, and the temperature of the solution. Acid blends can include HF alone (1-30 vol %), or combined with HCl (1-50 vol %), H2SO4 (1-20 vol %), HNO3 (1-40 vol %), and H3PO4 (1-40 vol %). The temperature of the acids preferably ranges from 25 to 60° C. Sonication or other type of agitation (such as spray-etching, for example) is desirable for solution convection within microholes, and for faster etching in the waist area.

The proposed approach also enables formation of angled holes. If the laser beam is directed onto the glass sample at an angle the damage and the etched hole will be also oriented at angle to the surface. The configuration of the laser setup may be designed in such a way that it will allow for making an array, which has both holes perpendicular to the glass surface and the angled ones, such as the holes 120 shown in the schematic cross section of a glass sheet 100 in FIG. 12.

Figure 13:
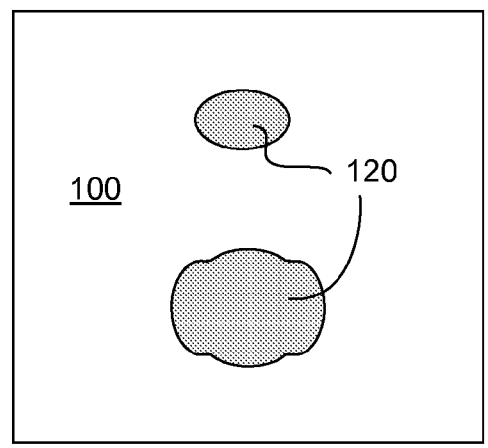
FIG. 13 is a schematic plan view of a glass sheet 100 showing alternative types of hole shapes of holes 120.

Beam-shaping may also be used, if desired, as a means to change the hole shape, to various shapes such as shown schematically in holes 120 on glass sheet 100 of FIG. 13. Elliptical holes have been produce by irradiating with an elliptical beam, and other shapes are possible by beam shaping through apertures and imaging, overlapping beams, and/or other techniques and combinations of techniques.

Figure 12:
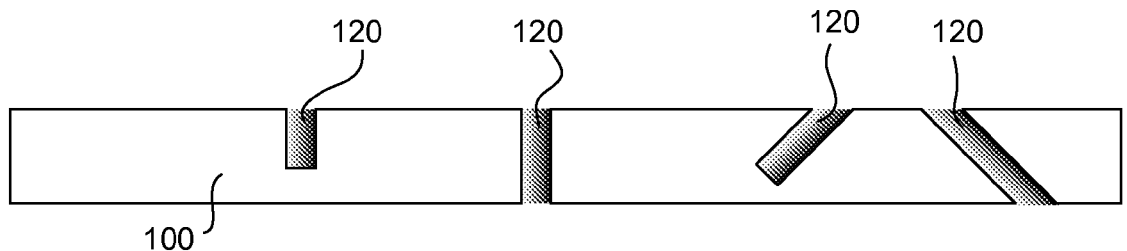
FIG. 12 is a schematic cross-section of a glass sheet 100 showing alternative types of holes 120.

Reducing the exposure duration enables making blind holes in addition to the through-holes described above, including both hole types on the same substrate, if desired, as also shown in FIG. 12. Blind holes will develop if, for example, the laser burst duration is reduced from 90 ms to approximately 10-20 ms. The resulting damage is similar with respect to the 7-10 um micro-channel described above, starting at the front surface of the glass and extending to some length inside the glass, which is a function of the ratio between the shortened duration and the full duration. Etching of such a track will produce a blind hole. A combination of through and blind holes of different depth within the same hole array.

Applying an acid-resistant film/coating to the glass surfaces can improve the hole shape even further. This coating may perform several functions: (a) protect the surface from the laser-ablated debris; (b) mitigate mechanical damage to the surface of the glass surrounding the exposed area; (c) prevent glass thinning during etching thus improving the hole aspect ratio. Such coating/film may be removable or it may be left on the glass if it does not prevent further processing.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of fabricating a high-density array of holes in glass, the method comprising:
   providing a glass piece having a front surface;
   irradiating the front surface of the glass piece with a UV laser beam, the beam being focused by a lens within +/−100 um of the front surface of the glass piece, the lens having a numerical aperture in the range of from 0.1 to 0.4, so as to produce open holes extending into the glass piece from the front surface of the glass piece, the holes having an diameter the in range of from 5 to 15 μm, and an aspect ratio of at least 20:1.

2. The method according to claim 1 wherein irradiating comprises using a laser beam with a wavelength in the range of from 200-400 nm.

3. The method according to claim 1 wherein irradiating comprises using a laser beam with a wavelength in the range of from 300-400 nm.

4. The method according to claim 3 wherein the near-UV laser used in the irradiating step is operated at 355 nm wavelength, plus or minus 5 nm.

5. The method according to claim 1 wherein the numerical aperture of the lens used in the irradiating step is within the range of from 0.1 to 0.15 for glass having a thickness in the range of 0.3 to 0.63 mm.

6. The method according to claim 1 wherein the numerical aperture of the lens is within the range of from 0.25 to 0.4 for glass having a thickness in the range of 0.1-0.3 mm.

7. The method according to claim 1 wherein the laser is operated during the irradiating step at repetition rate in the range of from 5 to 50 kHz.

8. The method according to claim 7 wherein the laser is operated during the irradiating step at repetition rate in the range of from 10 to 20 kHz.

9. The method according to claim 8 wherein the laser is operated during the irradiating step at repetition rate in the range of from 12-18 kHz.

10. The method according to claim 1 wherein the step of irradiating comprises irradiating the front surface of the glass piece with a UV laser beam for a duration in the range of from 8 to 150 milliseconds per hole.

11. The method according to claim 1 wherein the step of irradiating comprises irradiating the front surface of the glass piece with a UV laser beam for a duration in the range of about 10 milliseconds per hole for glass having a thickness of about 0.1 mm.

12. The method according to claim 1 wherein the step of irradiating comprises irradiating the front surface of the glass piece with a UV laser beam for a duration of about 10 milliseconds per 1/10 mm of glass thickness.

13. The method according to claim 1 wherein the piece of glass is a glass sheet, and wherein the step of irradiating comprises irradiating the front surface of the glass sheet with a UV laser beam for a duration determined by experiment or calculation to be that duration which will cause the resulting hole to extend just up to a back surface of the glass sheet.

14. The method according to claim 1 wherein the step of irradiating comprises irradiating the front surface of the piece of glass with a UV laser beam for a duration determined by experiment or calculation to be that duration which will cause the resulting hole to extend up to a location within the piece of glass.

15. The method according to claim 1 wherein the step of irradiating comprises irradiating with a laser beam having other than circular shape.

16. The method according to claim 1 wherein the step of irradiating comprises irradiating with a laser beam oriented at an angle other than 90 degrees to the front surface of the piece of glass.

17. The method according to claim 1 wherein the method further comprises etching the glass piece in acid.

18. The method according to claim 17 wherein the step of etching in acid further comprises etching in an acid blend.

19. The method according to claim 18 wherein the acid blend comprises a solution of 20% HF+10% $HNO_3$.

20. The method according to claim 1 further comprising, after irradiating and before etching, polishing the front surface of the glass piece.

* * * * *